United States Patent [19]
Liu

[11] Patent Number: 6,165,272
[45] Date of Patent: *Dec. 26, 2000

[54] CLOSED-LOOP CONTROLLED APPARATUS FOR PREVENTING CHAMBER CONTAMINATION

[75] Inventor: Wei-Jen Liu, Hsin-Chu, Taiwan

[73] Assignee: Taiwan Semiconductor Manufacturing Company, Ltd, Hsin Chu, Taiwan

[*] Notice: This patent is subject to a terminal disclaimer.

[21] Appl. No.: 09/156,339

[22] Filed: Sep. 18, 1998

[51] Int. Cl.⁷ .................................................. C23C 16/00
[52] U.S. Cl. ............................ 118/715; 118/692; 137/554
[58] Field of Search ..................................... 118/715, 710, 118/692; 138/45; 137/554, 118.04; 251/118

[56] References Cited

U.S. PATENT DOCUMENTS

| | | | |
|---|---|---|---|
| 4,717,596 | 1/1988 | Barbee et al. ............................ | 118/692 |
| 5,433,784 | 7/1995 | Miyagi et al. ............................ | 118/715 |
| 5,601,651 | 2/1997 | Watabe ..................................... | 118/715 |
| 5,888,579 | 3/1999 | Lun ......................................... | 118/692 |

OTHER PUBLICATIONS

Philip M. Gerhart and Richard J. Gross. Fundamental of Fluid Mechanics. Flow in a Converging–Diverging Nozzle, Addison–Wesley Publishing: 1985. pp. 719–723.

*Primary Examiner*—Gregory Mills
*Assistant Examiner*—Sylvia R. MacArthur
*Attorney, Agent, or Firm*—Tung & Associates

[57] ABSTRACT

A closed-loop controlled apparatus and method for preventing contamination to a low pressure chemical vapor deposition chamber (LPCVD) are provided. The apparatus includes an exhaust vent equipped with a butterfly valve for controlling a flow rate through the vent. The exhaust vent is connected to a vacuum outlet and a vacuum pump on a process chamber in parallel with and bypassing a gate valve such that the exhaust vent can be opened for the continuous pumping of the process chamber during wafer loading and unloading steps. The exhaust vent may be constructed by two end conduits that have a larger diameter which are connected by a middle conduit that has a smaller diameter such that during vacuum evacuation, the fluid flow rate in the small diameter conduit is at least four times that in the large conduit to effectively prevent the deposition and blockage of the small conduit by reaction by-products or contaminating particles. The butterfly valve installed in the exhaust vent provides an indication of the degree of blockage of the vent and enables a process controller to shut-off the process chamber for wet cleaning when a blockage has been detected for preventing chamber contamination.

15 Claims, 2 Drawing Sheets

CLOSED-LOOP CONTROLLED APPARATUS FOR PREVENTING CHAMBER CONTAMINATION

FIELD OF THE INVENTION

The present invention generally relates to an apparatus and method for semiconductor processing and more particularly, relates to a closed-loop controlled apparatus and method for preventing contamination in a semiconductor process chamber which includes an exhaust vent mounted to the process chamber such that the chamber may be continuously pumped during wafer loading and unloading, the vent is equipped with a reduced cross-sectional area for achieving increased fluid flow rate and a butterfly valve for adjusting the flow rate through the exhaust vent and for detecting when the vent is blocked by contaminating particles.

BACKGROUND OF THE INVENTION

In semiconductor processing, a large portion of the yield losses can be attributed to contaminations by particles and films of various nature. The contaminants may be organic or inorganic particles, films formed of polymeric bases, or other ionic based materials. The particles or films may be generated as byproducts in the reaction of reactant gases, by the surrounding environment, by the processing equipment or by the handling of manufacturing personnel. Some contaminants are particles or films generated from condensed organic vapors, solvent residues, photoresist or metal oxide compounds.

Typical problems and the detrimental effects caused by particle or film contaminants are poor adhesion of deposited layers, poor-formation of LOCOS oxides, or poor etching of the underlying material. The electrical properties and the stability of devices built on the semiconductor substrate may also be seriously affected by ionic based contaminants. The various forms of contaminants therefore not only reduce the product yield but also degrade the reliability of the devices built. For instance, contaminant particles can cause a device to fail by improperly defined patterns, by creating unpredictable surface topography, by inducing leakage current through insulating layer, or otherwise reducing the device lifetime. It is generally recognized that a particle contaminant that exceeds one-fifth to one-half of a minimum feature size on a device has the potential of causing a fatal defect, i.e. a defect that causes a device to fail completely. A defect of smaller size may also be fatal if it falls in a critical area, for instance, a particle contaminant in the gate oxide layer of a transistor. In modern high density devices, such as a dynamic random access memory chip, the maximum allowable number of particle contaminants per unit area of the device must be reduced accordingly in order to maintain an acceptable yield and reliability.

One of the widely used processing techniques for semiconductor wafers is a low pressure chemical vapor deposition (LPCVD) technique. A LPCVD process can be carried out in an apparatus such as that shown in FIG. 1. The LPCVD method has been widely used in the deposition of silicon nitride or TEOS oxide films on semiconductor wafers. In the method, a gas containing the structural elements of the film material to be formed is first fed into a chamber, followed by heating the gas mixture to induce a chemical reaction to deposit the desired film on the semiconductor substrate. In a conventional CVD method, a silicon nitride film can be deposited by a chemical reaction between silane ($SiH_4$) and ammonia ($NH_3$) at 1 ATM and a temperature of 700~900° C., or by a mixture of dichlorosilane ($SiCl_2H_2$) and ammonia at a reduced pressure and a temperature of 700~800° C.

As shown in FIG. 1, reactant gases of dichlorosilane 12 and ammonia 14, each carried by a carrier gas of nitrogen, are fed into the process chamber 18 through the inner tubes 40. The reaction gases are mixed at the bottom portion of inner tubes 40. Manifold 16 provides inlets and outlets for the gases and is used as a pedestal support for the inner tubes 40 and the outer tubes 24. The process chamber 18 is first evacuated by vacuum pump 20 prior to the reaction. A purge gas of nitrogen 22 is then used to fill the process chamber 18 and to drive out any residual gas left from the previous deposition cycle. A cold trap 26 maintained at sub-ambient temperature, e.g., of approximately 12~18° C., is used in the vacuum line to trap particles that cannot be pumped away. The manifold 16 is provided with a pressure sensor 28 which is connected via a conduit 30 to the manifold 16 at a pressure port 32. A main valve 34 and pressure switches (not shown) are provided in the vacuum evacuation line for controlling the fluid flow. A vent line 48 is connected to the vacuum evacuation line for venting spent reactant gases through control valves 52 and 54 to the exhaust vent 56.

After the reactant gases of $SiCl_2H_2$ and $NH_3$ are mixed in the inner tube 40, the gas mixture is flown into the process chamber 18 to deposit silicon nitride films on wafers held in a wafer boat (not shown). It has been observed that during the reaction between $SiCl_2H_2$ and $NH_3$, a reaction byproduct of $NH_4Cl$ is frequently produced. The ammonium chloride powder which is in a very fine powdery form causes a defect on the wafer surface known as nitride haze. It is believed that during a nitride deposition process, contaminating powder may be coated inside the conduit between the chamber 18 and the cold trap 26, inside the conduit between the cold trap 26 and the gate valve 34, inside the gate valve 34, and inside the conduit between the gate valve 34 and the automatic pressure controller 20. The powdery contaminant may then be siphoned back into the process chamber 18 during an unintentional back-flow process. The fine powder of ammonium chloride deposits on top of a wafer surface and forms a haze defect. The nitride haze, once formed, is very difficult to remove from the wafer surface. For instance, a wet scrubbing method by using a brush cannot remove the haze from the wafer surface. The nitride haze acts as an additional insulating layer on top of the silicon wafer and presents processing difficulties in subsequently carried out processes. One of such processing difficulties occurs in the formation of LOCOS oxide insulation. The nitride haze impedes the growth of LOCOS oxide. Similar contaminants have also been observed in a TEOS oxide deposition process with similarly undesirable results.

In an effort to reduce or eliminate the nitride haze problem, a bypass vent pipe has been used to bypass the gate valve and to provide continuous pumping of the chamber during wafer loading and unloading steps. Even though this method reduces somewhat the magnitude of the chamber contamination problem, the small vent tube used for bypassing the gate vale is frequently plugged with the contaminating particles. The cleaning of such tubes becomes a time and labor consuming process during a preventive maintenance procedure. It is therefore desirable to have a bypass vent pipe for use in such application that does not get plugged up and furthermore, it would be desirable to have a vent pipe that is capable of indicating when such blockage occurs so that the vent pipe may be serviced.

It is therefore an object of the present invention to provide a closed-loop controlled apparatus for preventing contamination to a low pressure chemical vapor deposition chamber that does not have the drawbacks or shortcomings of the conventional apparatus of a vent tube.

It is another object of the present invention to provide a closed-loop controlled apparatus for preventing contamination to a low pressure chemical vapor deposition chamber that utilizes an exhaust vent for bypassing a gate valve such that the chamber may be continuously pumped during wafer loading and unloading to prevent a back-flow of contaminating particles into the chamber.

It is a further object of the present invention to provide a closed-loop controlled apparatus for preventing contamination to a low pressure chemical vapor deposition chamber by utilizing an exhaust vent equipped with a reduced cross-sectional area such that a fluid flow rate through the area is significantly higher than through the other areas of the vent in order to prevent the cumulation of contaminating particles in the exhaust vent.

It is another further object of the present invention to provide a closed-loop controlled apparatus for preventing contamination to a low pressure chemical vapor deposition chamber which includes an exhaust vent that has conduits of large cross-sectional area connected by a conduit of small cross-sectional area such that any cumulation of a fine powdery ammonium chloride material in the exhaust vent can be avoided.

It is still another object of the present invention to provide a closed-loop controlled apparatus for preventing contamination to a low pressure chemical vapor deposition chamber which includes an exhaust vent that is equipped with a large diameter cross-sectional area and a butterfly valve contained therein for adjusting the fluid flow rate through the conduit.

It is yet another object of the present invention to provide a closed-loop controlled apparatus for preventing contamination to a low pressure chemical vapor deposition chamber which includes an exhaust vent that is equipped with a butterfly valve for controlling a fluid flow rate through the vent and for feeding back a signal to a controller such that the operation of the deposition chamber can be shut off when the angle of the butterfly valve exceeds a pre-set value.

It is still another further object of the present invention to provide a closed-loop controlled method for preventing contamination to a low pressure chemical vapor deposition chamber incorporating the steps of connecting an exhaust vent to the process chamber and equipping a conduit of the vent with a butterfly valve for adjusting a fluid flow rate through the conduit.

It is yet another further object of the present invention to provide a closed-loop controlled method for preventing contamination to a low pressure chemical vapor deposition chamber that utilizes an exhaust vent with a butterfly valve installed therein for adjusting a fluid flow rate and sending out a signal to a controller such that the operation of the deposition chamber can be shut off when the angle of the butterfly valve detected exceeds a pre-set value.

SUMMARY OF THE INVENTION

In accordance with the present invention, a closed-loop controlled apparatus and method for preventing contamination to a low pressure chemical vapor deposition chamber incorporating the use of an exhaust vent which has a reduced cross-sectional area therein and a butterfly valve installed in the vent for adjusting the fluid flow rate through the vent are disclosed.

In a preferred embodiment, a closed-loop controlled apparatus for preventing contamination to a low pressure chemical vapor deposition chamber can be provided which includes a chamber equipped with a vacuum port in fluid communication with a gate valve and a vacuum pump; an exhaust vent connected to the vacuum port and the vacuum pump in parallel with and bypassing the gate valve, the vent includes a first conduit and a second conduit connected in fluid communication with a middle conduit thereinbetween, the first conduit and the second conduit each has an internal diameter larger than the internal diameter of the middle conduit, and a pneumatic valve positioned in the middle conduit adapted for turning on or off the exhaust vent; a butterfly valve situated in the second conduit for adjusting a fluid flow rate through the conduit and sending out a signal to a controller indicating an angle of the valve; and a controller for shutting down the deposition chamber when the angle exceeds a pre-set value.

The closed-loop controlled apparatus may further include a cold trap connected in series and in fluid communication with the gate valve. The pneumatic valve is turned on during wafer loading and unloading processes into and out of the deposition chamber with the vacuum pump operating. The pre-set value of the angle of the butterfly valve is at least 60° as measured from a vertical axis. The first conduit and the second conduit each has an internal diameter at least two times the internal diameter of the middle conduit. The pneumatic valve may be a normal-closed air actuated valve. The first conduit and the second conduit may each have an internal diameter four times the internal diameter of the middle conduit.

The low pressure chemical vapor deposition chamber may be a silicon nitride deposition chamber or a TEOS oxide deposition chamber. The exhaust vent is turned on during wafer loading and unloading such that reaction by-products produced in the deposition chamber can be carried away by the vacuum pump. The deposition chamber may be a silicon nitride deposition chamber which generates a reaction by-product of $NH_4Cl$. A fluid flow rate in the middle conduit when the vacuum pump is operating is at least four times the fluid flow rate in the first and second conduit. A fluid flow rate in the middle conduit is higher than a fluid flow rate in the first and second conduit such that reaction by-products from the chamber does not cumulate in the conduit. The fluid flow rate in the middle conduit may be sufficiently high such that reaction by-products from the deposition chamber does not cumulate in the pneumatic valve. The exhaust vent operates to prevent any reaction by-products deposited in the first, second and middle conduit from being back-flowed into the deposition chamber.

The present invention is further directed to a closed-loop controlled method for preventing contamination to a low pressure chemical vapor deposition chamber which can be carried out by the operating steps of first providing a chamber equipped with a vacuum port in fluid communication with a gate valve and a vacuum pump; then connecting an exhaust vent in parallel with and bypassing the gate valve with a first conduit of the device connected to the vacuum port, a second conduit of the device connected to the vacuum pump and a middle conduit providing fluid communication between the first and the second conduit equipped with a pneumatic valve, the second conduit is equipped with a butterfly valve for adjusting a fluid flow therethrough; then turning on the pneumatic valve with the vacuum pump operating in loading/unloading at least one wafer into/from the deposition chamber; and adjusting an angle of the butterfly valve by a controller such that a pre-set fluid flow rate through the second conduit is maintained.

The closed-loop controlled method for preventing contamination may further include the step of providing the exhaust vent with a first and second conduit each has an internal diameter at least two times that of the middle conduit. The method may further include the step of shutting down the deposition chamber when the angle of the butterfly valve exceeds a pre-set value. The method may further include the step of providing the exhaust vent with a middle conduit smaller than the first and second conduit such that a sufficiently higher fluid flow rate can be generated in the middle conduit for preventing cumulation of reaction by-products in the middle conduit.

The closed-loop controlled method may further include the step of conducting a nitride deposition process on the at least one wafer or conducting a TEOS oxide deposition process on the at least one wafer. The method may further include the step of providing the exhaust vent with a first and second conduit each has an internal diameter at least two times that of the middle conduit. The method may further include the step of providing the pneumatic valve in a normal-closed air actuated valve. The method may further include the step of turning on the exhaust vent during wafer loading and unloading to carry away reaction by-products generated in the deposition chamber by a vacuum pump. The method may further include the step of turning on the exhaust vent during wafer loading and unloading to carry away ammonium chloride powder generated in a nitride deposition chamber by a vacuum pump. The method may further include the step of generating a fluid flow rate in the middle conduit that is sufficiently high such that reaction by-products from the deposition chamber do not cumulate in the pneumatic valve, and the step of preventing any reaction by-products deposited in the first, second and middle conduit from being back-flowed into the deposition chamber.

The present invention is further directed to a closed-loop controlled method for preventing contamination to a low pressure chemical vapor deposition chamber which includes the steps of first providing a chamber equipped with a vacuum port in fluid communication with a gate valve and a vacuum pump; then connecting an exhaust vent in parallel with and bypassing the gate valve with a first conduit of the device connected to the vacuum port, a second conduit of the device connected to the vacuum pump and a middle conduit providing fluid communication between the first and second conduit equipped with a pneumatic valve, the second conduit is equipped with a butterfly valve for adjusting a fluid flow therethrough; then turning on the pneumatic valve with the vacuum pump operating and loading/unloading at least one wafer into/from the deposition chamber; then detecting the fluid flow rate through the second conduit and an angle of the butterfly valve by a controller and shutting down the deposition chamber when the angle of the butterfly valve detected exceeds a pre-set value.

The closed-loop controlled method may further include the step of shutting down the deposition chamber when the angle of the butterfly valve detected exceeds 60° as measured from a vertical axis. The method may further include the step of wet cleaning the first, second and middle conduit of the exhaust vent and removing all contaminating particles on interior walls of the conduits when the pre-set value of the angle of the butterfly valve is detected.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
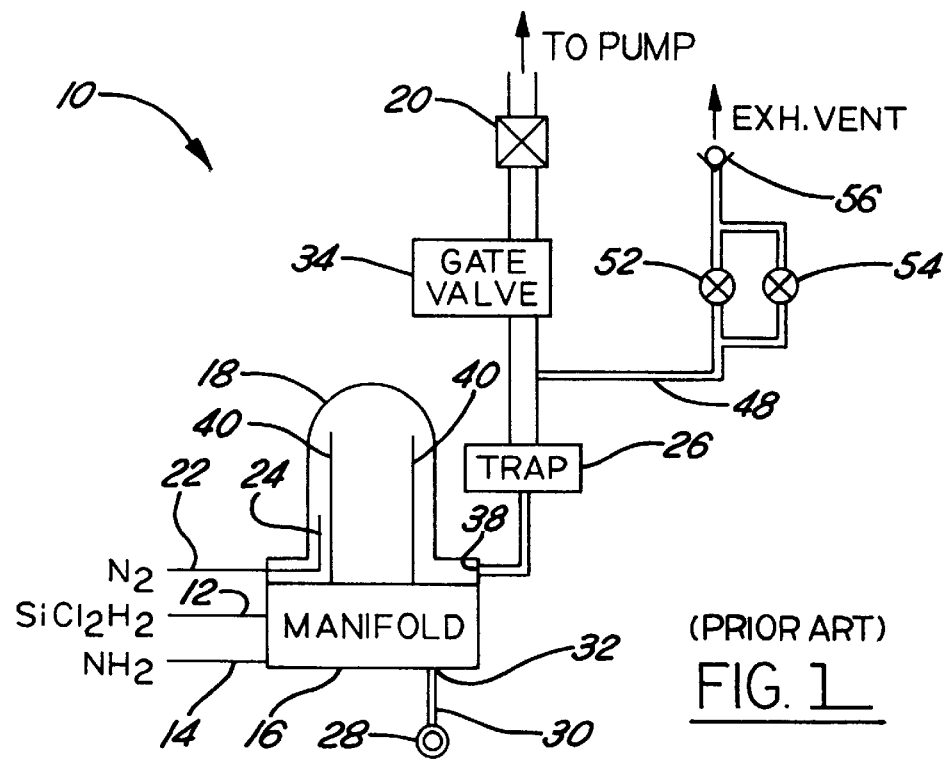
FIG. 1 is a diagram illustrating the configuration of a conventional semiconductor process chamber for the low pressure chemical vapor deposition of silicon nitride films.

The present invention discloses an apparatus and a method for a closed-loop control of a low pressure chemical vapor deposition chamber for preventing contamination which can be advantageously used in a deposition process for nitride films, TEOS oxide films or any other suitable films.

The present invention apparatus incorporates the use of an exhaust vent which is connected to a vent outlet and a vacuum pump of a LPCVD chamber in parallel with and bypassing a gate valve. The exhaust vent is constructed by a first and a second conduit on the two extreme ends while connected in fluid communication with a middle conduit therein between. The first conduit and the second conduit each has an internal diameter that is at least two times the internal diameter of the middle conduit, and preferably about 4 times the internal diameter of the middle conduit. The middle conduit further includes a pneumatic valve installed for turning on or turning off the exhaust vent. The second conduit which is connected to the vacuum pump is further equipped with a butterfly valve installed therein for controlling the fluid flow rate therethrough. The butterfly valve is further equipped with a position sensor such that the angle of the valve can be detected and a signal can be sent out to a controller for the LPCVD chamber. The function of the butterfly valve is to first adjust a fluid flow rate through the exhaust vent by maintaining a pre-set pump speed or flow rate. Secondly, the position or angle of the butterfly valve is detected such that when the angle reaches or exceeds a pre-set value, i.e., such as 60° as measured from a vertical axis, it indicates that the middle conduit is partially blocked by contaminating particles and the process chamber should be shut down for cleaning.

While the present invention apparatus and method may be advantageously used for any semiconductor processes, they are particularly suited for use in a low pressure chemical vapor deposition process. For instance, a LPCVD process which is frequently used for depositing silicon nitride films or TEOS oxide films. The processes for depositing such films have been known with particle contamination problems which cause a defect known as nitride haze. The nitride haze defect may result in the rework or scrap of a complete wafer. By utilizing the present invention novel apparatus and method, a TEOS oxide particle count can be reduced from over 1,000 to below 50 on each wafer. The present invention novel apparatus and method therefore enable a longer preventive maintenance period for the fabrication equipment. Furthermore, the apparatus and method not only solve the back-flow problem of contaminating particles into the reaction chamber, but also eliminates the frequent blockage of exhaust vent by contaminating particles.

The present invention novel apparatus and method solves the particle contamination problem in three ways. First, an exhaust vent is added to the process chamber such that the pumping of the chamber can be continued during boat-in/out (or wafer loading/unloading) processes for preventing the back-flow of contaminating particles deposited in the vacuum conduit. Secondly, the present invention novel apparatus utilizes an exhaust vent which is constructed by two large conduits connected by a small conduit. Based on a laminar flow principal, at the same volume of fluid flow, the velocity of the flow is inversely proportional to the cross-sectional area of the conduit. The fluid flow speed in the middle small tube is greatly increased for preventing any blockage in the small tube by the contaminating particles. Thirdly, a butterfly valve is mounted in the large conduit such that the fluid flow rate through the exhaust vent can be suitably adjusted. The position or angle of the butterfly valve is further detected and a signal sent to a process controller such that when the angle exceeds a preset value in order to keep a constant flow rate and therefore indicating a partial blockage of the conduit, the deposition chamber can be shut down for cleaning before serious contamination can occur.

The present invention apparatus may further be enhanced by heating elements that are installed on the vacuum conduits and by heating the conduits to a temperature between about 100° C. and about 180° C. such that potential deposition of the reaction by-products on the inner walls of the conduits can be prevented. This further reduces the occurrence of contaminating particles being flown back to the process chamber during boat in/out process.

The present invention apparatus of an exhaust vent equipped with a butterfly valve can be easily installed onto a process chamber after a preventive maintenance procedure is carried out. The exhaust vent which has various cross-sectional areas effectively prevents the blockage of the vent by contaminating particles with the butterfly valve acting as a warning device. When the butterfly valve has to be opened more in order to keep the same pump speed or flow rate through the exhaust vent, it is an indication that the exhaust vent is partially blocked by contaminating particles. In a typical nitride LPCVD process, such contaminating particles may be the reaction by-products of ammonium chloride.

The present invention apparatus further utilizes a horn-shaped exhaust vent in which two large end conduits are connected by a small conduit in the middle. Based on a laminar flow principal, when the fluid flow volume is kept constant, the flow speed through a conduit is inversely proportional to the cross-sectional area of the conduit. For instance, when the large end conduits have a diameter that is four times the smaller middle conduit, the flow velocity of the fluid flow through the small conduit may be sixteen times the flow velocity of the fluid flow through the large conduit.

Figure 2:
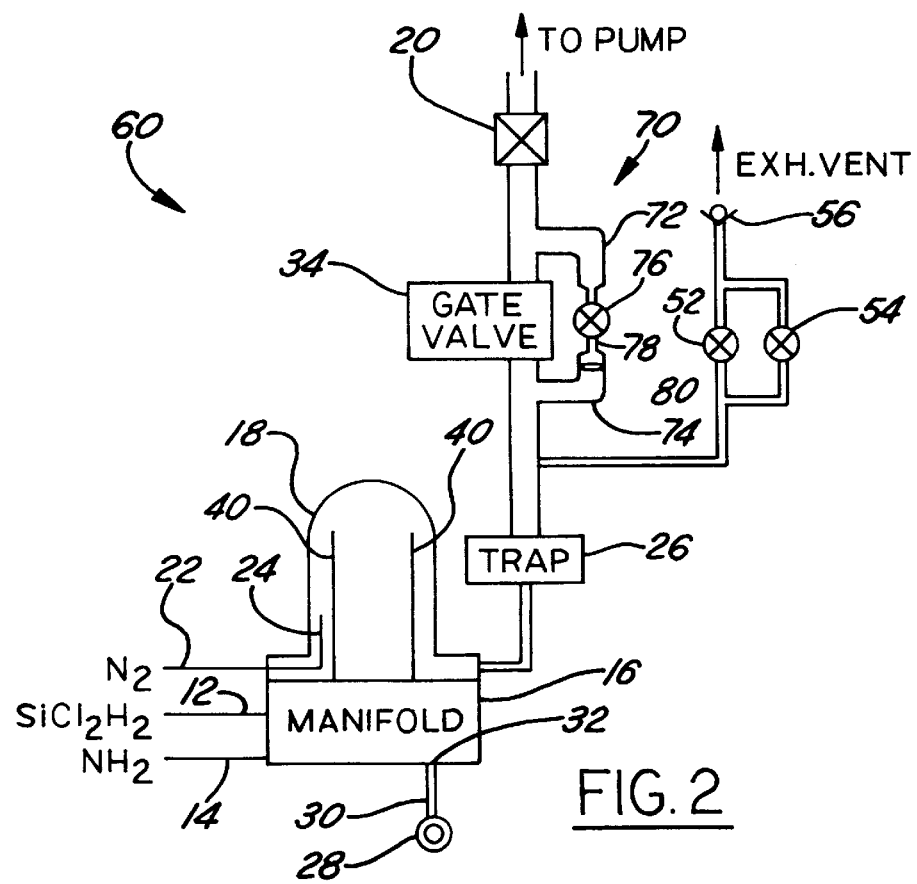
FIG. 2 is a diagram illustrating the configuration of the present invention process chamber for the chemical vapor deposition of silicon nitride films exemplified in the preferred embodiment.

Referring now to FIG. 2 which shows a present invention novel apparatus 60 that incorporates the use of an exhaust vent 70 and a butterfly valve 80 installed therein. The exhaust vent 70 is installed in parallel to and bypassing a gate valve 34. The exhaust vent 70 is constructed by a first conduit 72, a second conduit 74, a middle conduit 78, a pneumatic valve 76 installed in the middle conduit 78 and a butterfly valve 80 installed in the second conduit 74. The end of the first conduit 72 is connected to the vacuum conduit 62, while the end of the second conduit 74 is connected to the vacuum conduit 64. The vacuum conduit 62 is in turn connected to the vacuum pump (not shown) through an automatic pressure controller 20. The vacuum conduit 64 is in turn connected to the process chamber 18 through a cold trap 26.

Figure 3:
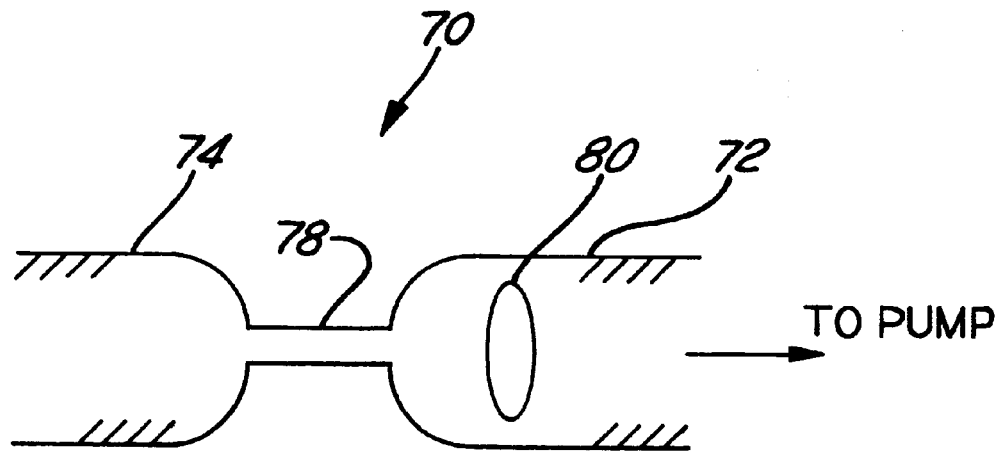
FIG. 3 is a diagram illustrating an enlarged, cross-sectional view of the present invention exhaust vent with a butterfly valve installed therein.
Figure 4:
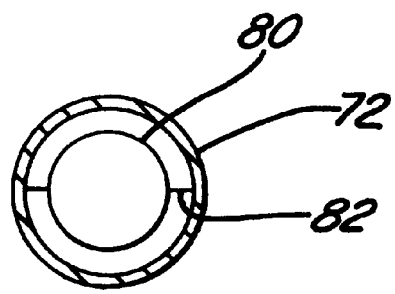
FIG. 4 is an enlarged, cross-sectional view of the exhaust vent with the butterfly valve installed therein and positioned at 0° angle from a vertical axis.
Figure 5:
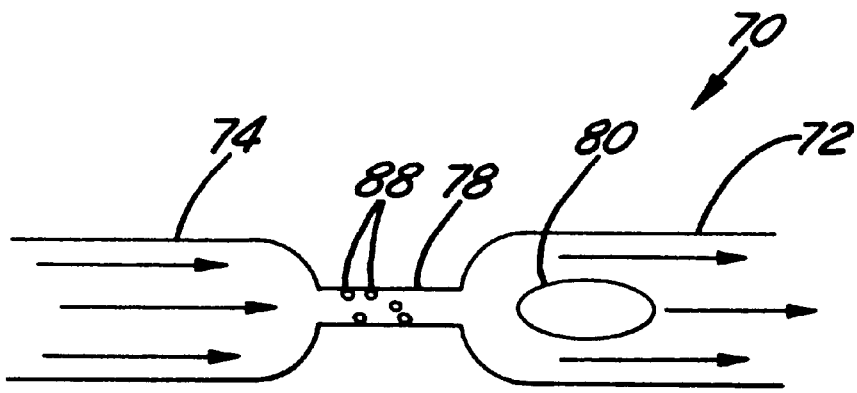
FIG. 5 is an enlarged, cross-sectional view of the present invention exhaust vent with a butterfly valve installed therein and opened at an angle of more than 60° from a vertical axis due to the presence of particle contamination in the vent.

An enlarged, cross-sectional view of the present invention exhaust vent 70 that includes a butterfly valve 80 installed therein is shown in FIG. 3. It should be noted that, for simplicity reasons, the pneumatic valve 76 is not shown in FIGS. 3 and 5. An enlarged, cross-sectional view of the butterfly valve 80 situated in the second conduit 72 is further shown in FIG. 4. As shown in FIG. 3, based on a laminar flow theory, the flow velocity of the fluid inside the conduits 72, 74 and 78 is inversely proportional to the cross-sectional areas of the conduits. For instance, when the diameters of the two end conduits 72, 74 is 1 inch (or 25.4 mm) and the diameter of the middle conduit 78 is ¼ inch (or 6.35 mm), the flow velocity in the middle conduit 78 is 16 times that of the flow velocity in the large conduits 72, 74. The higher flow velocity in the middle conduit 78 therefore effectively prevents any cumulation or deposition of contaminating particles on the interior walls of the conduit. However, after a prolonged usage, fine powders of ammonium chloride may still deposit on the conduit walls and thus require a detection of such blockage by the butterfly valve installed in the conduit. FIG. 5 shows an enlarged, cross-sectional view of the exhaust vent 70 with contaminating particles 88 deposited on the interior walls of the middle conduit 78.

The present invention novel apparatus functions in the following manner. At the beginning of a LPCVD process after a preventive maintenance procedure has been conducted, there are no contaminating particles deposited on the interior walls of the exhaust vent. The vent operates with the butterfly valve 80 in a vertical position (i.e., at 0° angle with the vertical axis) as shown in FIG. 3. The pump speed or the fluid flow rate of $N_2$ which is normally used for purging the process chamber is continuously monitored through the exhaust vent. The 0° angle position is also shown in FIG. 4. It should be noted that the butterfly valve 80 may be installed to the walls of the second conduit 72 by conventional means such as a shaft 82. Details of other mechanical means for turning the shaft 82 and adjusting the angle of the butterfly valve 80 is not shown. After a large number of wafers are processed in the chamber, there may be contaminating particles 88, as shown in FIG. 5, cumulating on the interior walls of the middle conduit 78. In order to maintain the same pump speed, or the same flow rate of $N_2$ through the exhaust vent 70, the controller opens the butterfly valve 80 to a larger angle. This is shown in FIG. 5. When the angle of the butterfly valve exceeds a pre-set value which was determined experimentally, i.e., about 60° when measured from the vertical axis, it indicates that the conduit is severely blocked. A signal of the large angle is sent back by the butterfly valve 80 to the process controller to shut down the process chamber for preventing contamination of the chamber by the back-flow of contaminating particles.

The angle of the butterfly valve is therefore an indication of how severe the blockage is in the conduit and as such, it can be used to reliably prevent any contamination of the process chamber in the event of particle back-flow. A closed-loop controlled system is therefore established in which the position of the butterfly valve determines when a preventive maintenance procedure for the process chamber is necessary. When such preventive maintenance procedure is necessary, the process chamber is opened and all conduits are wet cleaned to remove the deposits of the contaminating particles. It should be noted that the pre-set angle of 60° can be suitably changed to suit each individual application. In some applications, the pre-set angle may be set smaller before the preventive maintenance procedure is necessary. In some other applications, the pre-set angle may be set larger such that more wafers can be processed in the chamber before the chamber is shut down for wet cleaning.

The present invention apparatus of exhaust vent 70 and butterfly valve 80 can therefore be advantageously used during wafer loading and unloading by opening the vent 70 (with the gate valve 34 closed) and evacuated by a vacuum pump. The higher flow rate through the smaller cross-sectional area of the exhaust vent prevents the cumulation of contaminating particles in the vent. The butterfly valve 80 provides a reliable indication of when a blockage in the exhaust vent has occurred and when the process chamber needs to be cleaned of such contaminating particles. The preventive maintenance period can therefore be stretched out to improve the wafer yield.

The present invention novel apparatus and method have therefore been amply demonstrated in the above descriptions and in the appended drawings of FIGS. 2, 3, 4 and 5. It should be noted that while the process of a low pressure chemical vapor deposition for nitride and TEOS oxide is used for illustration, the present invention novel apparatus and method can be advantageously used in other low pressure processing techniques that require the evacuation of a process chamber and the prevention of any back-flow of contaminating particles into the chamber.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A closed-loop controlled apparatus for preventing contamination in a low pressure chemical vapor deposition chamber comprising:

a chamber equipped with a vacuum port in fluid communication with a gate valve and a vacuum pump, an exhaust vent connected to said vacuum port and said vacuum pump in parallel with and by-passing said gate valve, the vent comprises a first conduit and a second conduit connected in fluid communication with a middle conduit thereinbetween, said first conduit and said second conduit each having an internal diameter larger than the internal diameter of said middle conduit, and a pneumatic valve positioned in said middle conduit adapted for turning on or off said exhaust vent, a butterfly valve situated in one of said first and second conduit for adjusting a fluid flow rate therethrough and for sending out a signal to a controller indicating an angle of the valve, and a controller for shutting down the deposition chamber when said angle exceeds a preset value.

2. A closed-loop controlled apparatus for preventing contamination in a low pressure chemical vapor deposition chamber according to claim 1, wherein said chamber further comprises a cold trap connected in series and in fluid communication with said gate valve.

3. A closed-loop controlled apparatus for preventing contamination in a low pressure chemical vapor deposition chamber according to claim 1, wherein said pneumatic valve is turned on during wafer loading and unloading processes into and out of said deposition chamber with the vacuum pump in operation.

4. A closed-loop controlled apparatus for preventing contamination in a low pressure chemical vapor deposition chamber according to claim 1, wherein said pre-set value of the angle is at least 60° as measured from a vertical axis.

5. A closed-loop controlled apparatus for preventing contamination in a low pressure chemical vapor deposition chamber according to claim 1, wherein said first conduit and said second conduit each having an internal diameter at least two times the internal diameter of said middle conduit.

6. A closed-loop controlled apparatus for preventing contamination in a low pressure chemical vapor deposition chamber according to claim 1, wherein said pneumatic valve is a normal-closed air actuated valve.

7. A closed-loop controlled apparatus for preventing contamination in a low pressure chemical vapor deposition chamber according to claim 1, wherein said first conduit and said second conduit each having an internal diameter four times the internal diameter of said middle conduit.

8. A closed-loop controlled apparatus for preventing contamination in a low pressure chemical vapor deposition chamber according to claim 1, wherein said low pressure chemical vapor deposition chamber is a silicon nitride deposition chamber.

9. A closed-loop controlled apparatus for preventing contamination in a low pressure chemical vapor deposition chamber according to claim 1, wherein said exhaust vent is turned on during wafer loading and unloading such that reaction by-products produced in said deposition chamber is carried away by said vacuum pump.

10. A closed-loop controlled apparatus for preventing contamination in a low pressure chemical vapor deposition chamber according to claim 1, wherein said deposition chamber is a silicon nitride deposition chamber that generates a reaction by-product of $NH_4Cl$.

11. A closed-loop controlled apparatus for preventing contamination in a low pressure chemical vapor deposition chamber according to claim 1, wherein said deposition chamber is a TEOS oxide deposition chamber.

12. A closed-loop controlled apparatus for preventing contamination in a low pressure chemical vapor deposition chamber according to claim 1, wherein a fluid flow rate in said middle conduit with said vacuum pump operating is at least 4 times the fluid flow rate in said first and second conduit.

13. A closed-loop controlled apparatus for preventing contamination in a low pressure chemical vapor deposition chamber according to claim 1, wherein a fluid flow rate in said middle conduit is sufficiently higher than a fluid flow rate in said first and second conduit such that reaction by-products from said chamber do not cumulate in said middle conduit.

14. A closed-loop controlled apparatus for preventing contamination in a low pressure chemical vapor deposition chamber according to claim 1, wherein a fluid flow rate in said middle conduit is sufficiently high such that a reaction by-product from said deposition chamber does not cumulate in said pneumatic valve.

15. A closed-loop controlled apparatus for preventing contamination in a low pressure chemical vapor deposition chamber according to claim 1, wherein said exhaust vent operates to prevent any reaction by-product deposited in said first, second and middle conduit from back-flowed into said deposition chamber.

* * * * *